United States Patent [19]

Yuan et al.

[11] Patent Number: 5,380,672
[45] Date of Patent: Jan. 10, 1995

[54] DENSE VERTICAL PROGRAMMABLE READ ONLY MEMORY CELL STRUCTURES AND PROCESSES FOR MAKING THEM

[75] Inventors: Jack H. Yuan, Cupertino; Gheorghe Samachisa, San Jose; Daniel C. Guterman, Fremont; Eliyahou Harari, Los Gatos, all of Calif.

[73] Assignee: SunDisk Corporation, Santa Clara, Calif.

[21] Appl. No.: 117,219

[22] Filed: Sep. 3, 1993

Related U.S. Application Data

[62] Division of Ser. No. 629,250, Dec. 18, 1990, Pat. No. 5,343,063.

[51] Int. Cl.[6] .......................................... H01L 21/265
[52] U.S. Cl. .................................... 437/43; 365/185; 437/49
[58] Field of Search ................ 437/43, 49; 257/315, 257/316, 320; 365/185

[56] References Cited

U.S. PATENT DOCUMENTS

| | | | |
|---|---|---|---|
| 4,314,265 | 2/1982 | Simko | 357/23 |
| 4,331,968 | 5/1982 | Gosney, Jr. et al. | 357/23 |
| 4,486,769 | 12/1984 | Simko | 357/41 |
| 4,531,203 | 7/1985 | Masuoka et al. | 365/218 |
| 4,590,504 | 5/1986 | Guterman | 357/23.11 |
| 4,713,677 | 12/1987 | Tigelaar et al. | 357/23.5 |
| 4,796,228 | 1/1989 | Baglee | 365/185 |
| 4,803,529 | 2/1989 | Masuoka | 357/23.5 |
| 4,814,840 | 3/1989 | Kameda | 357/23.5 |
| 4,835,741 | 5/1989 | Baglee | 365/185 |
| 4,849,369 | 7/1989 | Jeuch et al. . | |
| 4,853,895 | 8/1989 | Mitchell et al. | 365/185 |
| 4,933,739 | 6/1990 | Harari | 357/55 |
| 4,958,318 | 9/1990 | Harari | 365/149 |
| 4,975,383 | 12/1990 | Baglee | 437/43 |
| 4,990,979 | 2/1991 | Otto . | |
| 4,996,572 | 2/1991 | Tanaka et al. . | |
| 5,041,886 | 8/1991 | Lee . | |
| 5,049,956 | 9/1991 | Yoshida . | |
| 5,053,839 | 10/1991 | Esquivel et al. . | |
| 5,071,782 | 12/1991 | Mori . | |
| 5,073,513 | 12/1991 | Lee | 437/43 |
| 5,078,498 | 1/1992 | Kadakia et al. . | |
| 5,111,270 | 5/1992 | Tzeng . | |
| 5,141,886 | 8/1992 | Mori | 437/43 |
| 5,153,684 | 10/1992 | Shoji et al. . | |

FOREIGN PATENT DOCUMENTS

| | | |
|---|---|---|
| 10258141 | 8/1987 | European Pat. Off. . |
| 10369895 | 10/1989 | European Pat. Off. . |
| 0349774A2 | 1/1990 | European Pat. Off. . |
| 58-054668 | 3/1983 | Japan . |
| 63-084165 | 4/1988 | Japan . |
| 2000360 | 1/1990 | Japan . |
| 2014582 | 1/1990 | Japan . |
| 272672 | 3/1990 | Japan . |
| 2110980 | 4/1990 | Japan . |

OTHER PUBLICATIONS

Berenga et al., "E[2]-PROM TV Synthesizer", *1978 IEEE International Solid-State Circuits Conference: ISSCC 78*, Feb. 17, 1978, pp. 196–197.

(List continued on next page.)

*Primary Examiner*—George Fourson
*Assistant Examiner*—Richard A. Booth
*Attorney, Agent, or Firm*—Majestic, Parsons, Siebert & Hsue

[57] ABSTRACT

A memory array of PROM, EPROM or EEPROM cells has each cell formed in a trench of a thick oxide layer deposited on a silicon substrate, in a manner that a significant portion of opposing areas of the floating gate and control gate of each cell which provide capacitive coupling between them are formed vertically. This allows the density of the array to be increased since the amount of semiconductor substrate area occupied by each cell is decreased without having to sacrifice the amount or quality of the capacitive coupling. Further, a technique of forming capacitive coupling between the floating gate and an erase gate in a flash EEPROM array cell with improved endurance is disclosed.

24 Claims, 8 Drawing Sheets

OTHER PUBLICATIONS

Wang et al., "Direct Moat Isolation for VLSI", *IEDM 81,* 1981, pp. 372-375.

Lee and Hu, "Polarity Asymmetry of Oxides Grown on Polycrystalline Silicon", *IEEE Transactions on Electron Devices,* 35:7, Jul. 1988, pp. 1063-1070

Wakamiya et al., "Fully Planarized 0.5μm Technologies for 16M Dram", *IEDM 88,* 1988, pp. 246-249.

Inoue et al., "A 16Mb DRAM with An Open Bit-Line Architecture", *ISSCC 88,* Feb. 19, 1988, pp. 246-247 and 388.

McCormick, "Flash-EPROMs und DRAMs-Ein Vergleich", *Elektronik,* vol. 2, Jan. 20, 1989, pp. 95-96. (Abstract in English.).

Bellezza et al., "A New Self-Aligned Field Oxide Cell for Multimegabit EPROMs", *IEDM 89,* 1989, pp. 579-582.

Hisamune et al., "A 3.6 μm² Memory Cell Structure for 16 MB EPROMs", *IEDM 89,* 1989, pp. 583-586.

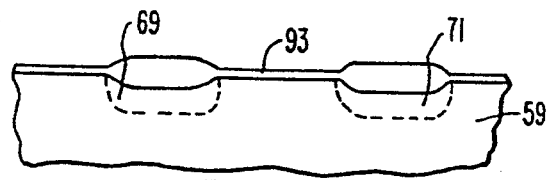
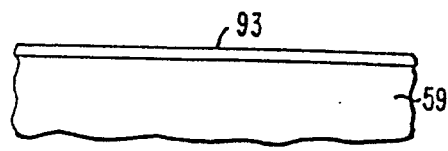
FIG. 9A.   FIG. 9B.
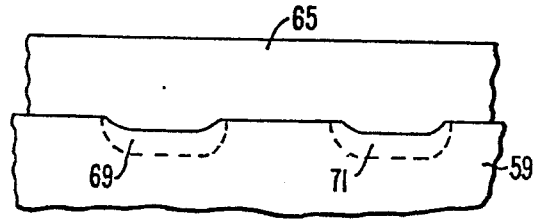
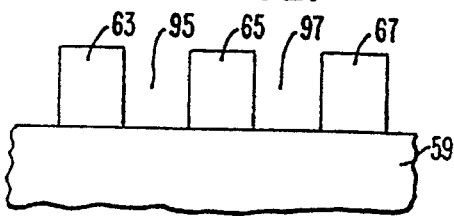
FIG. 10A.   FIG. 10B.
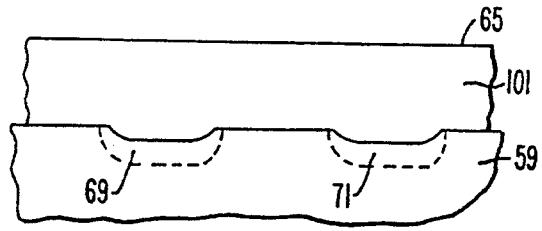
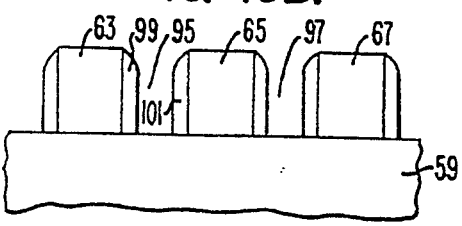
FIG. 11A.   FIG. 11B.
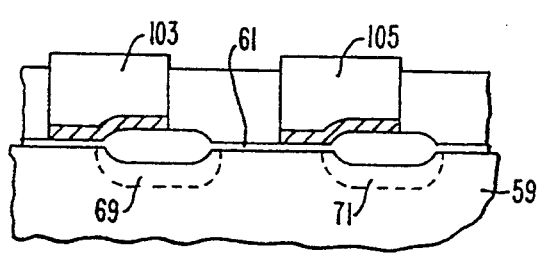
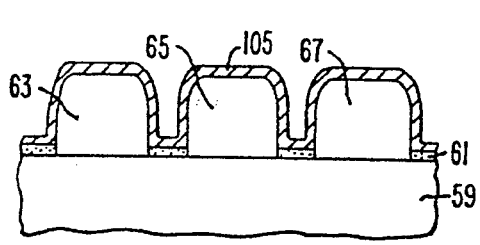
FIG. 12A.   FIG. 12B.
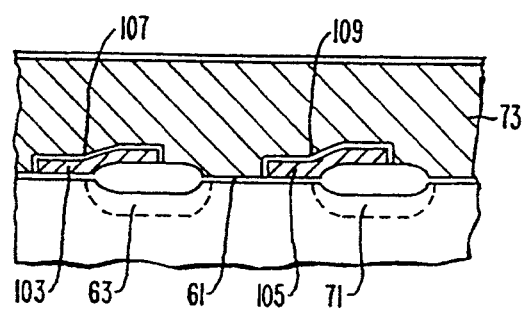
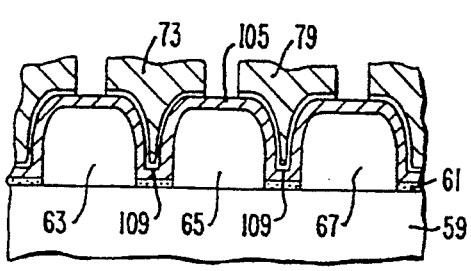
FIG. 13A.   FIG. 13B.

DENSE VERTICAL PROGRAMMABLE READ ONLY MEMORY CELL STRUCTURES AND PROCESSES FOR MAKING THEM

This is a division of application Ser. No. 07/629,250, filed Dec. 18, 1990, now U.S. Pat. No. 5,343,063.

BACKGROUND OF THE INVENTION

This invention relates generally to programmable read only memory (PROM) cell structures and processes of making them, particularly erasable (EPROM), electrically erasable (EEPROM), and flash EEPROM devices.

A main component of one of these types of PROM cell structures is a floating gate whose potential controls the conduction along at least a portion of a field effect transistor ("FET") channel between its source and drain regions in a semiconductor substrate. The floating gate is surrounded by an electrically insulated dielectric. A control or select gate is capacitively coupled with the floating gate through a dielectric layer and acts as a word line to enable reading or writing of a single selected cell in a two-dimensional array of cells. A selected cell is programmed by holding the control gate and its source and drain at appropriate voltages so that an electron travels from the substrate and to the floating gate through an intervening gate oxide layer by a mechanism that is referred to as "hot channel injection". If enough electrons are so injected into the floating gate, the conductivity of the channel of the field effect transistor of which the floating gate is a part is changed. By measuring the conductivity of a selected memory cell device, therefore, it is determined whether a binary "1" or "0" is being stored. Since the floating gate is well insulated, this type of memory device is not volatile; that is, the floating gate retains its charge for an indefinite period without any power being applied to the device.

Most PROMs are made to be erasable so that the state of the individual memory cells can be reprogrammed. The earliest erasable version of such cells is an EPROM which could be erased by exposure to strong ultraviolet light for 15 or 20 minutes. After erasure, the memory cell array can be electrically reprogrammed. More recently, EEPROM devices have been provided that allow the electrical erasure of individual addressed memory cells or designated groups of memory cells. During such erasure, the control gate, source and drain are held at a potential that causes the electrons to tunnel back through the gate oxide to the substrate region, usually the source. This can reverse the effect of an earlier programming by hot channel injection of electrons to the floating gate. Electrically erasable memory arrays which allow a large block of memory cells, or the entire array, to be erased at the same time, are known as "flash" EEPROMs. (That is, the entire memory array, or a large portion of it, is erased in a "flash".)

A specific form of a flash EEPROM structure utilizes a separate erase gate in addition to the control gates. The erase gate is capacitively coupled to the floating gate through a tunnel dielectric which allows electrons to travel through it from the floating gate to the erase gate upon the correct combination of voltages being applied to the control gate, erase gate, source and drain. The gates are generally formed by depositing polycrystalline silicon, which is then doped ("polysilicon"). The three gates are generally constructed from separate polysilicon layers (triple-poly) that are deposited and etched in sequence, along with deposition or growth of an insulating dielectric, usually oxide, between them. Asperities are usually formed on a surface area of the floating gate. The asperities, or roughness, on the surface of the floating gate help to concentrate electric fields to assist emission of electrons from the floating gate, which then travel through the tunnel dielectric and onto the erase gate.

It is currently a goal of many in the development of these types of non-volatile memory devices to provide an array having millions of individual memory cells on a single silicon integrated circuit chip of practical size. Sixteen and 64 megabit memory cells are currently contemplated. This trend requires that the silicon substrate area occupied by each cell be reduced as the number of cells placed on a single chip increases. This scaling down of the cell array structure has encountered several limitations.

One such limitation is the necessity for the capacitive coupling between the floating gate and the control gate to be maintained high in all of the PROM, EPROM and EEPROM devices. Specifically, in the case of a triple-poly flash EEPROM device, that capacitance should be equal to or greater than 70 percent of the total capacitive coupling of the floating gate with that and all other elements of the memory cell. That total capacitance includes coupling with the control gate, mentioned previously, plus coupling with the substrate and erase gate. Reducing the size of typical flash EEPROM cells does not reduce each of these capacitances proportionately, but rather reduces the floating gate/control gate capacitance in much greater proportion. Therefore, in order to maintain the high level of capacitive coupling between the floating gate and control gate, in light of the coupling area being reduced when the cell is made smaller, others have drastically reduced the thickness of the dielectric layer between them. The thin dielectric, usually an oxide layer grown on the floating gate polysilicon, however, has a higher failure rate and is difficult to maintain a high manufacturing yield. These factors limit the amount of adjustment in capacitance that can be provided by the thinner oxide to overcome the effect of the smaller coupling area that results from decreasing the overall cell size. Alternatively, some have added a nitride layer with the thin oxide to overcome these difficulties while maintaining a high level of capacitive coupling. But this technique will not compensate for continued cell size reductions beyond some limit.

Another obstacle to downward scaling of PROM, EPROM and EEPROM arrays is the problem of providing adequate electrical isolation between adjacent cells. The conventional technique is to separate cells by isoplanar oxidation. That is, a thick field oxide is grown on the silicon substrate surface in areas around where the individual memory cells are to be formed, thus providing an electrical separation. This technique suffers from an encroachment of the field oxide into the cell area by a gradually decreasing thickness portion, known as a "bird's beak" because of its shape when viewed in cross-section. This gradually decreasing field oxide thickness region contributes little to isolation of adjacent cells, but takes up a considerable amount of space. Also, stresses associated with the thick field oxide formations along the bird's beak can result in defects, particularly when that transition region is made to be more abrupt. There has been some thought of etching away the bird's beak portion and then forming the cell in the enlarged substrate area formed by the etching, but it is difficult to etch a varying thickness oxide layer without damaging the underlying silicon substrate surface. As a result, the formation of a cell over such regions is not desirable.

Yet another limitation to the downward scaling of the size of a flash EEPROM memory array exists where the floating gate is processed to provide asperities on a surface area that is capacitively coupled to an erase gate through a tunnel dielectric layer between them. Since electrons travel from the floating gate to the erase gate during an erase operation, the asperities need to be formed on the floating gate. This requires, with currently utilized processes, that the polysilicon layer for the floating gates be formed before the polysilicon layer for the erase gates. This usual procedure can be a constraint on scaling, however. Further, this known asperity-enhanced electron tunneling has a limited endurance to the number of memory cell writing and erasing cycles that the erase dielectric can endure. This is thought to be due primarily to the trapping of electrons in the tunnel dielectric in the vicinity of the floating gate asperities.

Accordingly, it is a primary object of the present invention to provide a technique for scaling down EPROM or EEPROM cell arrays beyond that which is possible by use of current techniques having the foregoing limitations.

It is another object of the present invention to provide an EPROM or EEPROM structure which retains efficient programming, erasing, reading, and immunity to disturbing conditions, even when the memory cells are extremely small.

It is a further object of the present invention to provide an EPROM or EEPROM structure with an improved cell isolation and smaller cell size.

It is yet another object of the present invention to provide an EPROM or EEPROM cell having a planer topology and which has a high degree of insensitivity to misalignment between photo masks which are used to define critical layers.

A further object of the present invention is to provide a flash EEPROM, structure having an improved endurance to repetitive programming and erasing cycles.

It is also an object of the present invention to provide very dense arrays of EPROM or EEPROM cells, thereby to increase the storage capacity of a memory array formed on an integrated circuit chip of reasonable size.

SUMMARY OF THE INVENTION

These and additional objects are accomplished by the various aspects of the present invention, wherein, briefly and generally, according to one aspect, EPROM and EEPROM cells are reduced in size, and thus the density of cells on a given sized circuit chip is increased, by vertically orienting a significant proportion of the floating and control gate areas that provide the capacitive coupling between them.

This is accomplished, in a preferred embodiment, by first depositing a layer of thick oxide on the silicon substrate, and then forming vertically walled trenches in the oxide layer by anisotropically etching through to the substrate surface. The cells are then constructed in the trenches and the thick oxide between trenches provides effective electrical isolation between adjacent memory cells. In this way, sufficient coupling area between the floating gate and control gate is provided in order to maintain the necessary proportion of that capacitance relative to the total capacitive coupling with the floating gate for optimum performance. This can be done without having to make an oxide dielectric layer between them so thin as to jeopardize the performance, life or yield of such devices. This technique can be combined with an oxide/nitride sandwich dielectric to further increase the capacitive coupling, if so desired. Essentially the entire structure of each memory cell is formed in a trench, the bottom of the trench being the channel between adjacent source and drain diffusions in the substrate. The problem of wasted birds's beak areas that result from growing field oxide on the silicon surface is avoided by this structure and technique.

Optionally, the trenches can be reduced in width beyond that allowed by the resolution of current photolithography, by forming dielectric spacers against their sidewalls after etching the trench but before building the memory cell elements in it.

Further, the trenches may have their sidewalls sloped somewhat by initially performing an isotropic etch, which causes their top portion to be wider than the mask opening through which the etching is taking place, followed by an anisotropic etching step through the same mask opening that completes the trench. This combination isotropic/anisotropic trench forming process beneficially reduces some constraints on other portions of the process.

According to another aspect of the present invention, briefly and generally, in the case of a flash EEPROM, the polysilicon layer forming the erase gates can be deposited prior to the polysilicon layer that forms the floating gate and still operate with satisfactory tunneling of electrons from the floating gate through an intermediate dielectric to the erase gate. Of course, asperities directed toward the erase gate cannot be formed on the floating gate when it is constructed second since the areas where asperities are desired are deposited on an already formed surface of the dielectric layer that must be preserved. Asperities still could be physically formed on the erase gate, but this is detrimental since it is receiving the electrons through the erase dielectric, not sending them. Asperities can assist only in the emission, or sending, process.

In order to facilitate emission of electrons from the subsequently deposited layer (the floating gate) to the previously deposited layer (the erase gate), the first polysilicon layer is formed by an in situ process which introduces the dopant, phosphorous in a specific embodiment, with the polysilicon at the time of the layer is being deposited, and a virgin oxide layer is then grown on a surface of the polysilicon layer. The second polysilicon layer is then formed over this oxide layer by a conventional technique. The resulting device exhibits a greater conduction of electrons from the second polysilicon layer (floating gate) to the first polysilicon layer (erase gate), than in the other direction. This is the reverse of the usual non-symmetrical tunnel oxide, and is termed "reverse tunneling".

Additional objects, features and advantages of the various aspects of the present invention will become apparent from the following description of its several preferred embodiments, which description should be taken in conjunction with the accompanying drawings.

BRIEF DESCRIPTION OF THE DRAWINGS

FIGS. 9A, 10A, 11A, 12A, and 13A illustrate sequential process steps in manufacturing the array of FIGS. 6–8, as viewed across section a—a of FIG. 6;

FIG. 9B, 10B, 11B, 12B, and 13B illustrate sequential process steps in manufacturing the array of FIGS. 6–8, as viewed across section b—b of FIG. 6;

DESCRIPTION OF THE PREFERRED EMBODIMENTS

Figure 1:
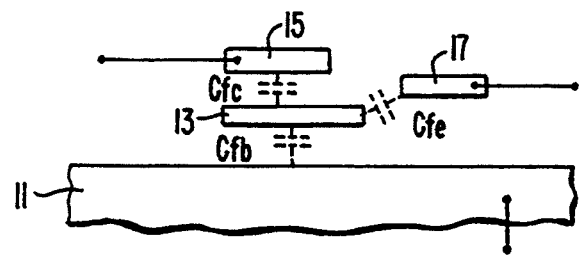
FIG. 1 is a partial equivalent circuit of an EEPROM cell showing the capacitive coupling with a floating gate.

Referring initially to FIG. 1, a memory cell is schematically and very generally illustrated to have a substrate 11 and a floating gate 13. Although the floating gate 13 is isolated from electrical connection with the substrate 11 and all other elements of the memory cell, it does have a capacitance $C_{FB}$ with the substrate 11. A control gate 15, whose voltage is controllable from the outside, is capacitively coupled with the floating gate 13, as indicated by capacitance $C_{FC}$. These capacitances exist in all PROM, EPROM and EEPROM devices. If an EEPROM device is provided with a separate erase gate 17, then there is a further capacitive coupling between it and the floating gate 13, designated as $C_{FE}$.

In order to achieve efficient device performance during programming, erasing and reading, it is highly desirable that the coupling ratio of the cell be equal to or greater than 0.7. The coupling ratio is defined as the ratio of the capacitance $C_{FC}$ to a sum of all three of the capacitances $C_{FC}$, $C_{FB}$, and $C_{FE}$. Thus, it can be seen that an actual EEPROM device must be constructed to have relatively large values of $C_{FC}$ and relatively small values of $C_{FE}$ and $C_{FB}$. As is well known, the amount of capacitance between any two gates is dependent upon the amount of their opposing surface areas, and the thickness of a dielectric layer between them, and a dielectric constant. Assuming that the insulating dielectric is made as thin as reasonably possible, then these capacitances are governed primarily by the amount of opposing surface area.

The requirement that $C_{FC}$ be relatively large makes it difficult to reduce the size of the memory cells with the primary coupling areas being oriented parallel to (horizontal) the substrate surface. Therefore, according to the present invention, a significant proportion of the capacitance $C_{FC}$ is provided by opposing floating gate and control gate surface areas that are oriented substantially perpendicularly (vertical) to the substrate surface. This allows the amount of surface area ("footprint") of the memory cell to be reduced without having to proportionately give up an amount of surface area forming the capacitance $C_{FC}$.

Figure 2:
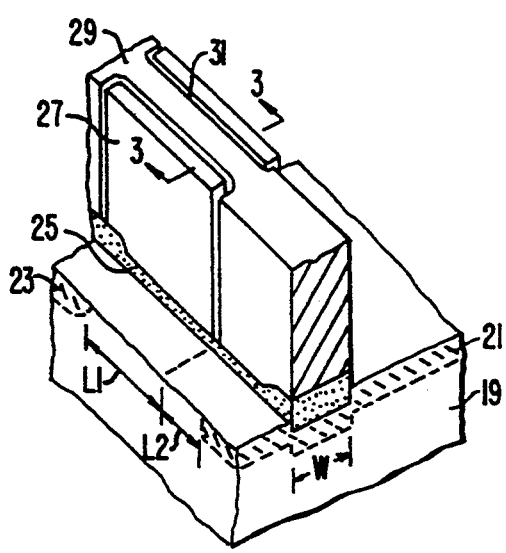
FIG. 2 conceptually shows a core portion of an EPROM or EEPROM cell structure utilized in four specific (first, second, fourth and fifth) embodiments of the present invention.
Figure 4:
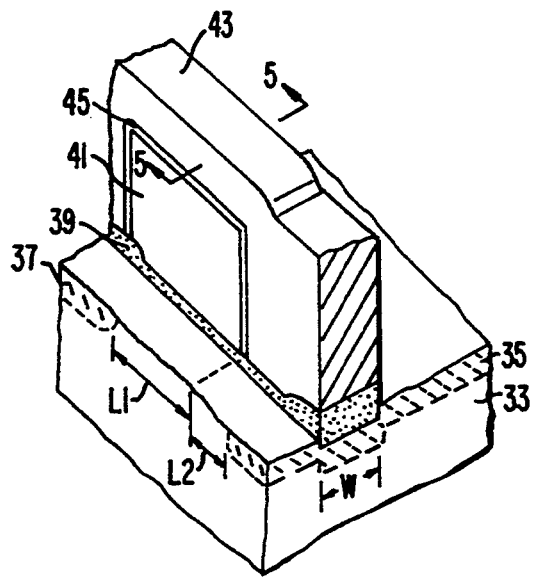
FIG. 4 conceptually shows a core portion of an EPROM or EEPROM cell structure utilized in another specific (third) embodiments of the present invention.

Two such vertical arrangements are conceptually illustrated in FIGS. 2–5. In FIG. 2, a semiconductor substrate 19 has source and drain diffusions 21 and 23 in parallel elongated strips that are spaced apart from each other. A gate oxide layer 25, having been grown on the top surface of the substrate 19, extends between the source and drain diffusions 21 and 23 in a strip that is substantially perpendicular to the length of those diffusions. The gate oxide 25 covers a channel region between the source and drain diffusions. Extending over a portion of that channel is a floating gate 27. Extending across the entire channel and beyond is a control gate 29. Each of the floating gate 27 and control gate 29 are made of an electrically conductive material, preferably doped polysilicon. The two conductive layers are separated by a control gate dielectric layer 31.

Figure 3:
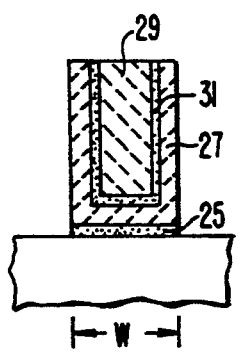
FIG. 3 is a sectional view of the memory cell of FIG. 2, taken at section 3—3 thereof.
Figure 5:
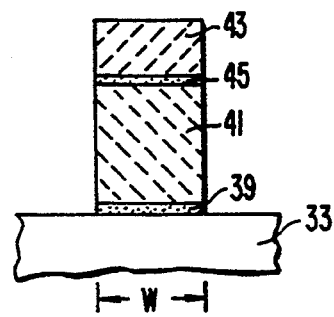
FIG. 5 is a sectional view of the memory cell of FIG. 4, taken at section 5—5 thereof.

It can be seen from FIG. 2 and its sectional view of FIG. 3 that a substantial amount of the opposing area of each of the floating gate 27 and control gate 29 that forms the capacitive coupling $C_{FC}$ therebetween is in vertical surfaces. Of course, the proportion of the capacitance $C_{FC}$ that is provided by vertical surfaces depends on the relative dimensions of the structure, but this arrangement can quite easily provide in excess of 35 or 40 percent of the coupling area in vertical surfaces, and even as high as 50 or 60 percent or more.

The type of cell illustrated in FIG. 2 is a split-channel type. That is, the surface at the bottom of the floating gate 27 extends across only a portion L1 of the channel distance between the source and drain diffusions 21 and 23. That floating gate bottom surface, separated from the substrate by the gate oxide 25, acts as any other field effect transistor gate; that is, the potential on the floating gate 27 determines whether electrons are permitted to travel across the substrate channel under the gate oxide layer 25 between the source and drain. The remaining portion L2 of the channel has its conductivity controlled by a bottom surface of the control gate 29, and in effect, is a separately controlled field effect transistor in series with that formed by the floating gate 27. This is a well-known split-channel type of device. Alternatively, where a split-channel device is not desired, the floating gate 27 can extend completely across the channel between the source and drain diffusions 21 and 23. In either case, the channel is shown in FIG. 2 to have a uniform width W therealong.

In the conceptual example of FIGS. 2 and 3, the control gate 29 effectively passes through an interior space of a U-shaped floating gate 27, thus providing a significant amount of vertical surface area therebetween. As another conceptual example, shown in FIGS. 4 and 5, a substrate 33 similarly contains source and drain diffusions 35 and 37 with a surface gate oxide layer 39 extending therebetween over a device channel region. In this case, a floating gate 41 is substantially solid, with a control gate 43 surrounding it and a control gate dielectric layer 45 therebetween. Here, the opposing vertical surfaces between the floating gate 41 and control gate 43 are at the end surfaces of the floating gate 41, extending across the structure, rather than the internal surfaces extending along the length of the structure in the example of FIG. 2. Depending upon the relative dimensions of the elements of the example cell of FIGS. 4 and 5, at least 35 or 40 percent of the surface coupling area can be provided in vertical surfaces, and 50 percent or more being possible as well.

In the two conceptual examples shown in FIGS. 2 through 5, no separate erase gate is shown, but could be utilized in such a cell, if desired. The structural features illustrated by these examples can be utilized in any of PROM, EPROM, EEPROM or flash EEPROM cells.

With this basic feature of vertical surface coupling between the floating gate and the control gate having been explained with respect to the examples of FIGS. 2 through 5, five specific flash EEPROM arrays, and processes of making them, will now be described with respect to the remaining FIGS. 6-27. Common to each of these five embodiments is a process of forming the vertical structures wherein a thick layer of dielectric is first deposited on the semiconductor substrate surface with a substantially uniform thickness, and then parallel, elongated trenches are etched in the dielectric until the substrate surface is showing at their bottoms. The individual memory cell devices are then formed in the trenches by building alternative layers of dielectric and electrically conductive polysilicon. The trenches can be made as close together as permitted by the resolution capability of existing or future photolithography techniques. The remaining dielectric between the trenches serves to electrically isolate their memory cells. As a result of the devices being built completely above the surface of the substrate, this isolation is extremely effective and allows the cells to be very densely packed.

First Embodiment

Figure 6:
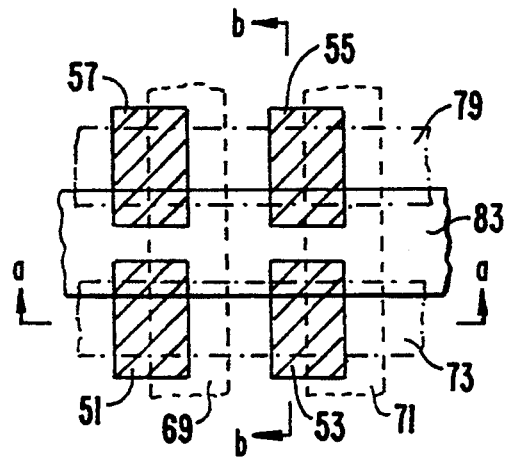
FIG. 6 is a plan view of a flash EEPROM array according to a first embodiment of the present invention.
Figure 7:
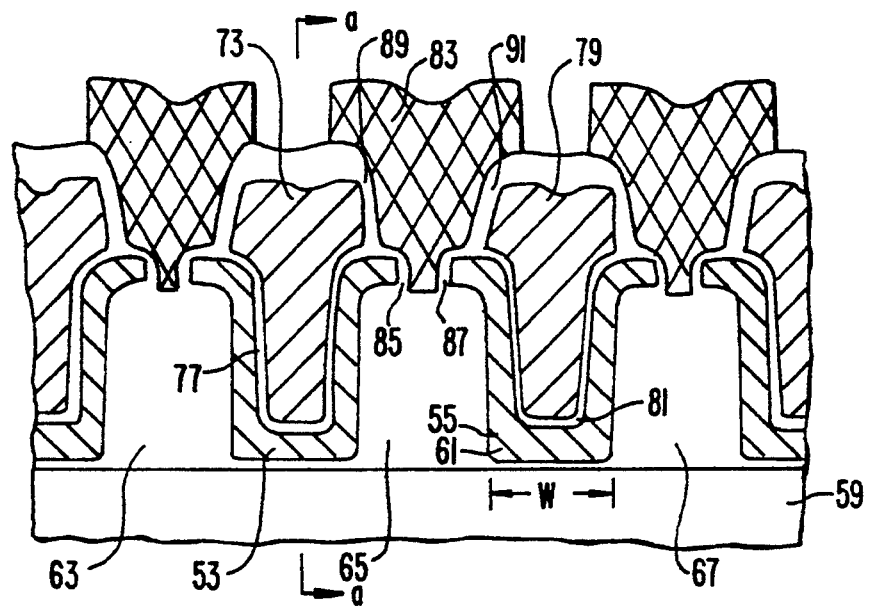
FIG. 7 is a sectional view of the array of FIG. 6, taken at section b—b thereof.
Figure 8:
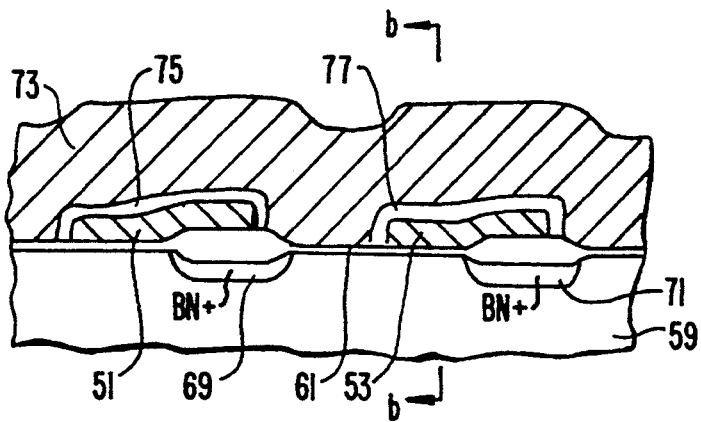
FIG. 8 is a sectional view of the array of FIG. 6, taken at section a—a thereof.

A first specific preferred embodiment, corresponding to the type of cell conceptually illustrated in FIGS. 2 and 3, is shown in plan view in FIG. 6, with cross-sectional views thereof provided in FIGS. 7 and 8. These figures illustrate four memory cells from a much larger symmetrical, two-dimensional array. Each of the four cells has an isolated floating gate, indicated by reference numbers 51, 53, 55 and 57. As shown in the sectional views of FIGS. 7 and 8, these floating gates are separated from a semiconductor substrate 59 by a gate oxide layer 61 that has been grown on its top surface. Thick oxide strips 63, 65 and 67 physically separate and electrically isolate the floating gates in one direction across the substrate.

The substrate has a plurality of elongated, parallel and spaced-apart source and drain diffusions, such as those indicated at 69 and 71. The thick oxide strips 63, 65 and 67 extend across the substrate with their lengths oriented in a direction substantially orthogonal to the lengths of the source and drain diffusions 69 and 71. These thick oxide strips form trenches between them in which the individual memory cell structures are positioned. Section a—a of FIG. 6, shown in FIG. 8, is taken along the length of one of these trenches. The memory cells being illustrated in this description are of a split-channel type, so the floating gates 51 and 53 are shown to extend only a portion of the distance between adjacent source and drain diffusions 69 and 71. The remaining distance of the channel region between source/drain diffusions is controlled by a control gate 73 that extends the length of the trench across all of the spaced-apart floating gate structures provided along its length. The control gate 73 is separated from the substrate by the gate oxide 61, and separated from the control gates 51 and 53 by respective dielectric layers 75 and 77. Such a control gate is provided in each trench, a control gate 79 (FIG. 6) being provided in an adjacent trench.

In the first embodiment of FIGS. 6-8, the floating gates are extended outside of their respective trenches on top of the adjacent thick oxide strips in order to provide a surface for tunnelling electrons to the erase gates. For example, an elongated erase gate 83, with its length oriented parallel with the trenches and the control gates, is provided atop the thick oxide layer 65 and is coupled with adjacent top edges of floating gates 53 and 55 through respective erase gate tunnel dielectric layers 85 and 87. The erase gate 83 is separated from adjacent control gates 73 and 79 by respective dielectric layers 89 and 91 which desirably isolate the erase and control gates with little coupling between them.

Additional detailed end features of the structure of FIGS. 6-8 can be understood by reviewing the basic process steps used in constructing that device. These steps are sequentially illustrated in FIGS. 9-15. The individual process steps illustrated in each of the FIGS. 9-13 are shown by orthogonal cross-sectional views of FIG. 6, corresponding to the sectional views of FIGS. 7 and 8 for the finished device.

A first series of processing steps is illustrated in FIG. 9A (section a—a of FIG. 6) and FIG. 9B (section b—b of FIG. 6). The elongated, parallel and spaced-apart source and drain diffusions 69 and 71 are first formed in the substrate 59. A thin, protective oxide layer 93 is then grown over the substrate surface, resulting in the usual thicker oxide layers over the heavily doped source and drain regions 69 and 71.

A next series of steps, illustrated in FIGS. 10A and 10B, is to deposit a thick oxide layer uniformly over the protective oxide layer 93 on the silicon substrate upper surface. A standard chemical vapor deposition process is preferred. Next, a plurality of elongated, parallel, spaced-apart trenches, such as the trenches 95 and 97, are etched through this uniform oxide layer to leave the elongated oxide strips 63, 65 and 67 as isolation between the trenches. This is the state of the structure illustrated in FIGS. 10A and 10B.

In order to maximize the density of the memory cell array being conformed, the trenches and oxide strips between them are made to be as small as allowed by a standard photolithography masking step that is used to form them. The thickness of the oxide initially deposited, and thus the height of the oxide strips 63, 65 and 67, is chosen to have a relationship with the width of the trenches, in order to form a high proportion of the coupling areas between the floating gates and the control gates in vertical surfaces. The depth of the thick oxide layer is chosen to be at least equal to or greater than about one-half the width of the trenches being formed. It is preferable, however, that the thick oxide layer depth be substantially equal to or greater than the width of the trenches, a proportion illustrated in FIG. 10B.

An anisotropic etching process is used to form the trenches, including trenches 95 and 97, in the thick oxide layer. This results in vertical surface walls of the trenches, substantially perpendicular to the surface of the substrate 59. The oxide is etched completely through to the surface of the substrate 59, including through the protective oxide layer 93. Since the oxide being etched is of uniform thickness, potential damage to the substrate surface that can result from etching away uneven oxides, such as would exist with a thermally grown oxide layer having its characteristic bird's beak shape, does not present a problem here. Further, because of the vertical walls, the demarcation between trenches, and thus between adjacent memory cells, is very sharp, as opposed to the case where a thermally grown field oxide is used for isolation and its edges have the undesirable bird's beak region of wasted space. Thus, the packing density of the memory cells can be very high.

Additionally, since the deposited thick oxide layer is provided totally on top of the silicon substrate, the resulting thick oxide strips, such as strips 63, 65 and 67, provide very good isolation between the cells, even when they are spaced closely together. For this reason, etching of the trenches is stopped at the substrate surface. No part of the memory cell gate structures are built into any trench or groove of the substrate, thereby avoiding parasitic leakages that result, such as conduction paths through the substrate between device structures formed in adjacent substrate grooves.

A next, optional but preferable, step is illustrated in FIGS. 11A and 11B to reduce the width of the trenches to something smaller than is possible by the resolution of standard photolithography techniques. This is done by forming spacers on the inside wall of the trenches, such as spacers 99 and 101 on the side walls of the trench 95. Such spacers are formed by depositing an oxide layer over the entire substrate surface, and then anisotropically etching that entire oxide layer until the portions formed on flat surfaces have been removed, thus leaving the spacers on the vertical side walls of the trenches. The thickness of the spacers is controlled by the thickness of the initial oxide layer deposited on the substrate surface. The width of the trenches can easily be reduced by about one-half by this technique. This directly reduces the width W of the cells to be formed in the trenches, thus reducing the capacitive coupling $C_{FB}$ between the floating gates and the substrate. This assists in increasing the coupling ratio of the cell. The smaller dimension, in addition to reducing the channel width of the devices, increases the spacing between adjacent channels and thus allows the full resolution capabilities of photolithography masking to be utilized to make the thick oxide spacers 63, 65, and 67 as thin as possible.

Existing state of the art photolithography techniques allow about one-half micron line resolution. Thus, the width of the trenches 95 and 97, as shown in FIG. 10B, can be defined to have a one-half micron width. The spacers 63, 65, and 67 between the trenches can also be formed with one-half micron width. The height of the spacers, defined by the thickness of the thick oxide layer initially deposited on the wafer, is made to be one-half micron or greater. A significant advantage of the structure and process being described is that it can automatically take advantage of increased integrated circuit resolution capabilities that will undoubtedly be available in the future. Thus, the individual cell sizes will automatically become smaller with future improved resolution techniques, and the density of a memory array higher, by utilizing this improved technology.

With reference to FIGS. 12A and 12B, a next step is to grow the layer 61 of high quality gate oxide on the exposed top surface of the silicon substrate 59 in the bottom of the trenches. Thereafter, a first layer of polysilicon is deposited over the entire substrate area and then portions removed to leave strips of polysilicon extending across the substrate in a direction perpendicular to the length of the trenches. Strips 103 and 105 are illustrated in FIGS. 12A and 12B, and are later separated into individual floating gates. The polysilicon closely conforms to the outside walls of the trenches. The more gentle slope provided by the addition of the spacers makes this deposition step easier than it is if the spacers are not used and the polysilicon must be deposited on totally vertical walls. However, it can be done without the spacers if desirable, for some reason.

The next sequence of steps, as illustrated in FIGS. 13A and 13B, relates to the formation of control gates. A first step is to grow a thin oxide layer over the first polysilicon layer strips, such as oxide layers 107 and 109. This is the oxide layer that affects the capacitance $C_{FC}$ which is desired to be maximized. Because of the vertical structure of the capacitive surface area that is provided by the present invention, this oxide layer need not be made so thin as to jeopardize reliability, yield and operation of the memory cells.

A next step is to then form control gates by first depositing a second polysilicon layer over the entire wafer surface, and then removing portions of it to leave elongated, parallel strips that form the control gates, such as control gates 73 and 79. The second polysilicon layer is deposited thick enough to fill in the remaining portion of the trenches, thus providing a relatively smooth top surface from which to work.

Figure 14:
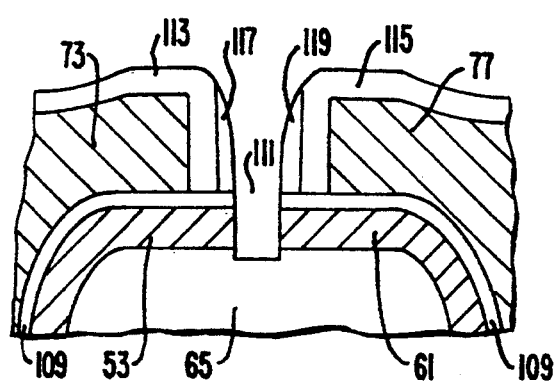
FIGS. 14 and 15 illustrate additional processing steps of the embodiment of FIGS. 6–8, as viewed across section b—b thereof.
Figure 15:
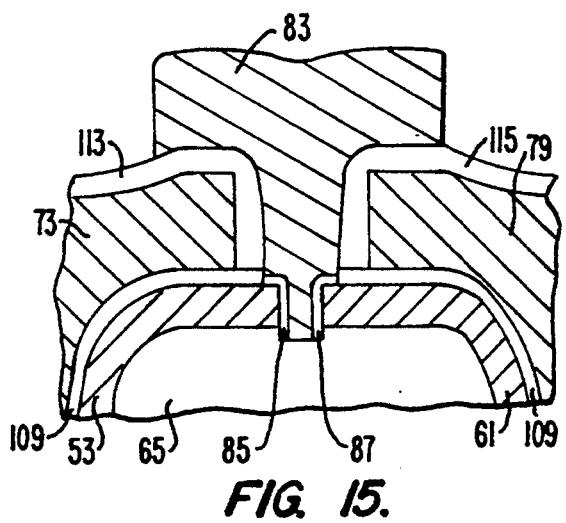
Figure 19A:
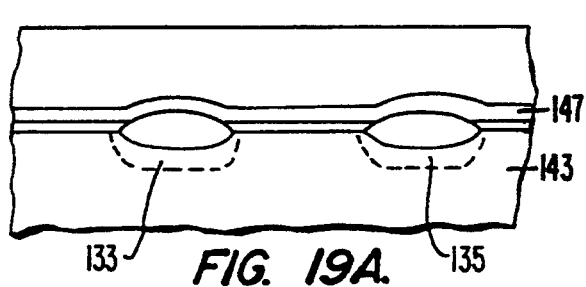
FIGS. 19A, 20A, and 21A illustrate sequential process steps in manufacturing the array of FIGS. 17 and 18, as viewed across section a—a of FIG. 16.
Figure 19B:
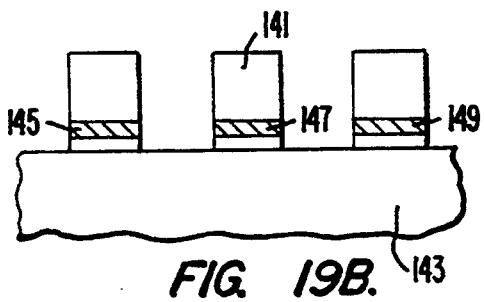
FIGS. 19B, 20B, and 21B illustrate sequential process steps in manufacturing the array of FIGS. 17 and 18, as viewed across section b—b of FIG. 16.

The remaining steps of the process are directed to separation of the first polysilicon layer strips 103 and 105 into individual floating gates and the formation of erase gates. These steps are illustrated in FIGS. 14 and 15. These are exploded views of a portion of FIG. 13B with the additional steps being accomplished. The control gates 73 and 79 are utilized to define a mask region 111 for etching through the first polysilicon layer strip 105 to separate it into its individual floating gates 53 and 61. This is accomplished by first forming dielectric layers 113 and 115 along the edges of the control gates 73 and 79, respectively. Spacers 117 and 119 are then temporarily formed to define the region 111. After etching through the first polysilicon layer by using the opening 111 to define the etched region, the spacers 117 and 119, and any of the oxide layer 109 under them, are removed and replaced, as indicated in FIG. 15, by tunnel erase dielectric layers 85 and 87 on exposed edge sidewalls, corners and a defined portion of the top surfaces of adjacent floating gates 53 and 61. This technique is more fully described in co-pending patent application Ser. No. 07/323,779, filed Mar. 15, 1989, now U.S. Pat. No. 5,070,032 particularly with respect to FIGS. 8–12 thereof, which disclosure is hereby incorporated by reference.

After the erase dielectric layers 85 and 87 are formed, a third polysilicon layer is deposited over the substrate surface and then portions removed to leave parallel erase gates, such as an erase gate 83.

Second Embodiment

Figure 16:
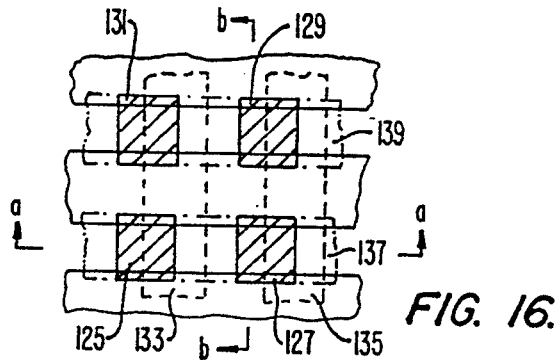
FIG. 16 is a plan view of a flash EEPROM cell array according to second and third embodiments thereof.
Figure 17:
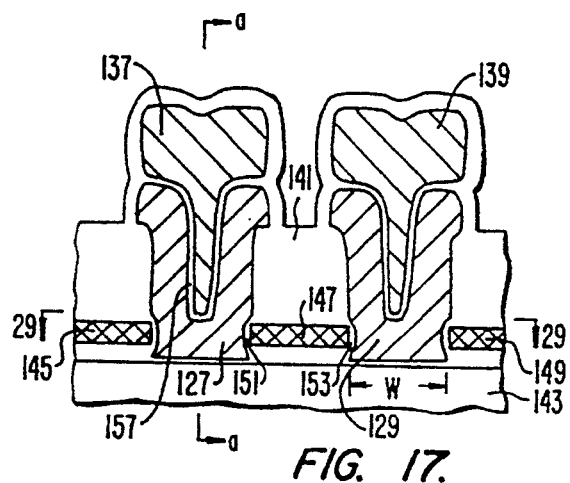
FIG. 17 is a sectional view of the array of FIG. 16, taken at section b—b thereof, and showing the second embodiment.
Figure 18:
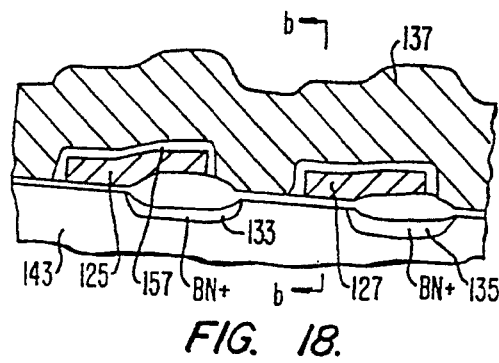
FIG. 18 is a sectional view of the array of FIG. 16, taken at section a—a thereof, and showing the second embodiment.

A second specific memory cell array embodiment is given by the cross-sectional views of FIGS. 17 and 18, taken across a general plan view of FIG. 16 at sections b—b and a—a, respectively. FIG. 16 shows, for example, four cells of a very large array of cells, these four having individual floating gates 125, 127, 129 and 131. These floating gates are arranged with respect to elongated source and drain diffusions 133 and 135 in a manner similar to that of the first embodiment described above. Also similar to the first embodiment are elongated control gates 137 and 139 provided in adjacent trenches in a thick field oxide layer 141 above the surface of a semiconductor substrate 143. A primary difference between the second embodiment of FIGS. 17 and 18 and the first embodiment of FIGS. 6–8 is that the erase gates are buried in the thick oxide layer 141, rather than being formed on top of the thick oxide layer. In this example, elongated erase gate strips 145, 147 and 149 are buried in each thick oxide strip and coupled to the floating gates in the trenches on the opposite sides of the thick oxide strip in which the erase gate is embedded. The erase gate 147, for example, is coupled with floating gates 127 and 129 by respective erase gate oxide layers 151 and 153.

An added advantage of this second embodiment over the structure of the first embodiment described above is that the edges of the floating gates do not need to be extended outside the trench regions for coupling with an erase gate formed above the thick oxide layer. In this second embodiment, essentially all of the cell structure is within the trench. Some extension of the floating and control gate structures outside of the trench, as shown in FIG. 17, needs to be provided in order to make sure the trenches are filled, given resolution and mask alignment tolerances of state of the art integrated circuit processing techniques. But that extension may be less than that necessary in the first embodiment of FIGS. 6–8.

A few of the processing steps in the second embodiment that are materially different from those of the first are illustrated in the sequential views of FIGS. 19–21. The initial formation steps are the same as those described with respect to FIGS. 9 and 10 for the first embodiment, except that a first layer of polysilicon is deposited over a protective oxide layer on the silicon substrate 143 surface before the thick oxide layer 141 is deposited. Thus, when the trenches are formed in the thick oxide layer by anisotropic etching, this continuous polysilicon layer is etched away in the trench regions as well, leaving the erase strips 145, 147 and 149. The technique self-aligns the erase gates with the trenches, and thus self-aligns them with the floating gates that are subsequently formed in the trenches.

Figure 20A:
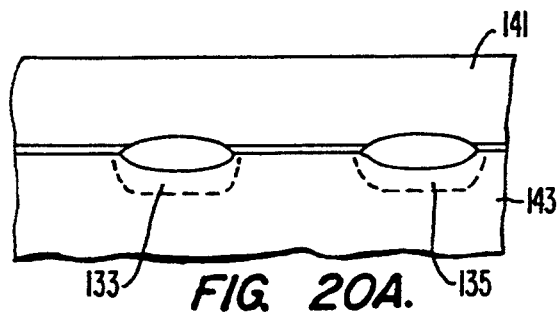
Figure 20B:
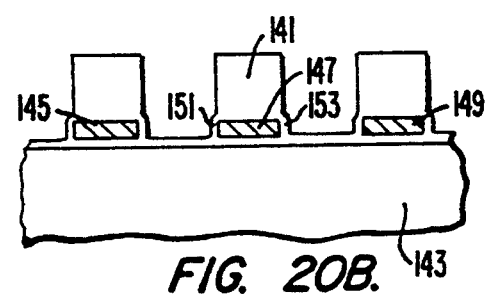

An extra step involved in making the memory array of the second embodiment, not present in the first embodiment, is the formation of the erase dielectric 151 and 153 along the edges of the erase gates prior to the formation of the floating gates in the trenches by a second polysilicon layer. This is illustrated in FIG. 20B.

Figure 21A:
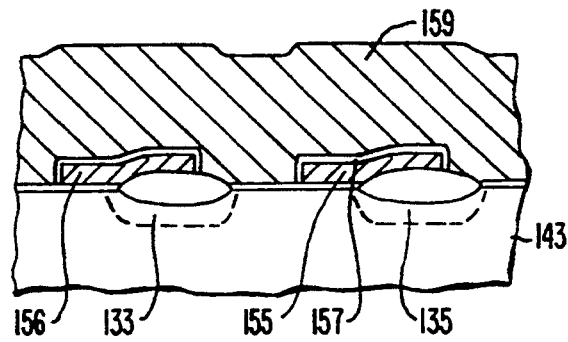
Figure 21B:
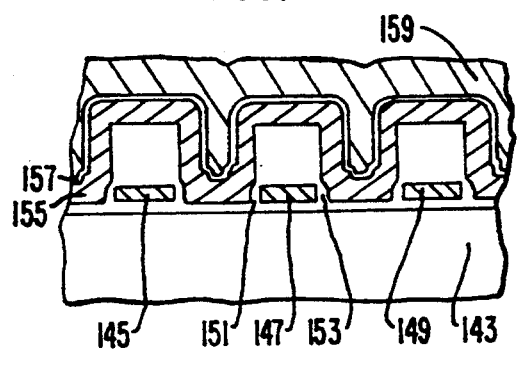

FIG. 21B shows another stage of the process of making the second memory cell embodiment. A second polysilicon layer is then deposited over the entire substrate, conforming to the trench side walls. This layer is initially etched into spaced-apart polysilicon strips 155 and 156, whose length extends across a number of trenches. A next step is the growing of an oxide layer 157 on the strips of the second polysilicon layer. Next, a third polysilicon layer 159 is deposited over the entire silicon surface, and this is the state of the device as illustrated in FIGS. 21A and 21B.

Subsequently, the second and third polysilicon layers 155 and 159, along with the interpoly dielectric layer 157, are etched by a single step to result in the structure illustrated in FIGS. 16–18.

Third Embodiment

Figure 22:
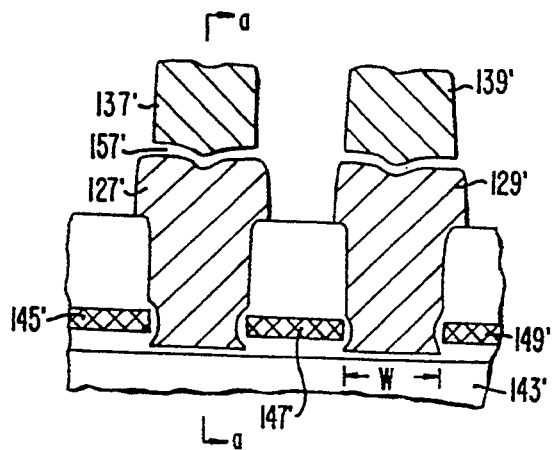
FIG. 22 shows a cross-sectional view of the array of FIG. 16, taken at section b—b thereof, and showing the third embodiment.
Figure 23:
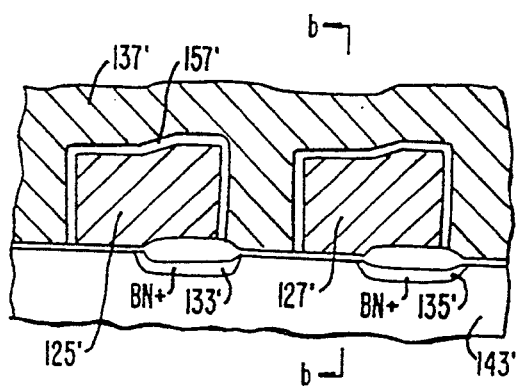
FIG. 23 is a sectional view of the array of FIG. 16, taken at section a—a thereof, and showing the third embodiment.

A variation of the second embodiment just described is a third embodiment illustrated in the sectional views of FIGS. 22 and 23. Elements of the embodiment of FIGS. 22 and 23 that are the same of that of embodiment of FIGS. 17 and 18 are indicated by the same reference number, but with a prime (') added. As can be seen from the figures, a primary difference is in the shape that the floating gates 125' and 127' are made to take, and then the resulting difference in shape of the control gates 137' and 139'. During the processing step of forming the second polysilicon layer from which the floating gates 127' and 129' result, the polysilicon deposition is continued for a time sufficient to fill the trenches and have a substantially smooth surface on the top of the floating gates. After the interpoly dielectric layer is grown over the floating gate top and end walls within the trench, as illustrated by the dielectric layer 157' of FIG. 23, the third polysilicon layer is deposited from which the control gates 137' and 139' are formed. The third polysilicon layer deposition is continued for long enough to fill in the trench spaces between the floating gates. This third embodiment of FIGS. 22 and 23 operates in a manner described earlier with respect to the conceptual example of FIGS. 4 and 5.

The formation of spacers along the vertical walls of the trenches is not shown in the drawing FIGS. 16–23 of the second and third embodiments but it will be understood that spacers can be used to reduce the width of the trenches in those embodiments as well, if desired. In such a case, spacers are formed in the same manner as described for the first embodiment (FIGS. 11A and 11B) but at a stage before a continuous layer of polysilicon is etched through to form the individual erase gates shown in FIGS. 19A and 19B. That is, rather than etching directly through the thick oxide and polysilicon layers all the way to the substrate surface, as shown in FIGS. 19A and 19B, the thick oxide layer is first etched alone to form trenches that expose the polysilicon layer at their bottom. That is, an initial step in forming the trenches etches only the top thick oxide layer and stops at the polysilicon layer. Spacers are then formed along the trench sidewalls in the manner described earlier with respect to the first embodiment. The polysilicon and thin oxide layer beneath it is then etched between the spacers, using the spacers as a mask, until the surface of the substrate 143 is exposed to form the bottom of the trench. The goal of a reduced width trench is then achieved. Processing then continues with the steps described with respect to FIGS. 20A and 20B.

Fourth Embodiment

Figure 24:
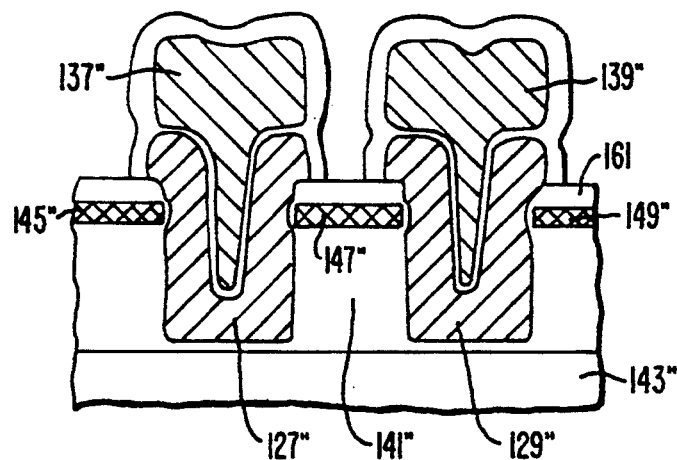
FIGS. 24 is a cross-sectional view of a fourth embodiment, as viewed at section b—b of FIG. 16.

A fourth embodiment is illustrated in FIG. 24. As a second variation of the second embodiment of FIGS. 17 and 18, the cross-section of FIG. 24 is similar to that of FIG. 17 with corresponding elements marked with the same reference numbers, but with a double-prime (") added. The main difference in this embodiment is the provision of the erase gates 145", 147" and 149" along a top surface of the thick oxide layer 141", rather than near its bottom. A process in making the cell of FIG. 24 is similar to that of the cell in FIGS. 17 and 18, except that the thick oxide layer is deposited on the silicon substrate 143" before the first polysilicon layer is deposited from which the erase gates are constructed. A dielectric layer 161 is also then added over the entire wafer surface to the top of the first polysilicon layer. When the trenches in the thick oxide layer 141" are anisotropically etched, this top protective oxide layer 161 and the first polysilicon layer are also etched.

Location of the erase gates toward the top side of the thick oxide layer, rather than near the substrate side, can also be employed as a modification in the embodiment of FIGS. 22 and 23. In either event, coupling between the edges of the erase gates and the adjacent floating gates formed in the trenches is provided in a self-aligned manner.

An advantage of forming the erase gates over the thick oxide, in the manner shown in the embodiment of FIG. 24, is the high voltage isolation of the erase gates from the substrate, if such is needed. There is an advantage, however, of placing the erase gates close to the semiconductor substrate in the manner shown in the embodiments of FIGS. 17, 18, 22 and 23. If the erase gates are separated from the substrate surface by a thin gate-like oxide layer, the potential on the erase gates will strongly affect the conductivity of the silicon substrate beneath it, just as an ordinary gate affects the conductivity of the channel in a field effect transistor. In normal operation of the memory, therefore, a potential may be placed on the erase gate which further aids in providing isolation between channels of adjacent trenches. That is, by creating a field in the semiconductor substrate between the trenches, the erase gate can aid in preventing electrons from migrating between the channels formed under adjacent trenches.

Fifth Embodiment

Figure 25:
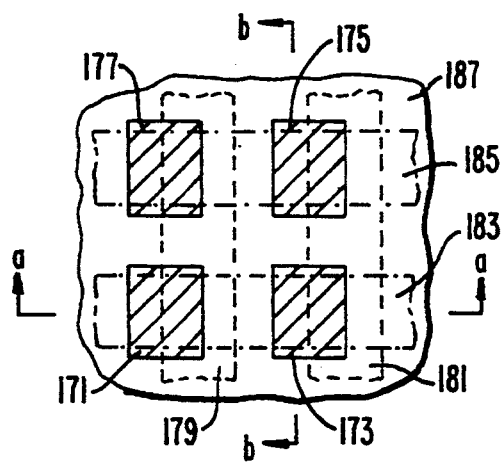
FIG. 25 is a plan view of a flash EEPROM cell array according to a fifth embodiment of the present invention.
Figure 26:
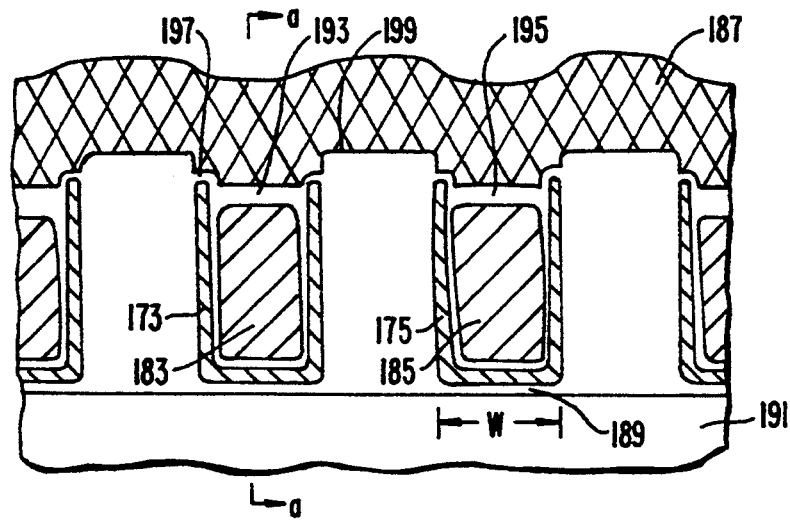
FIG. 26 is a cross-sectional view of the embodiment of FIG. 25, taken at section b—b thereof.
Figure 27:
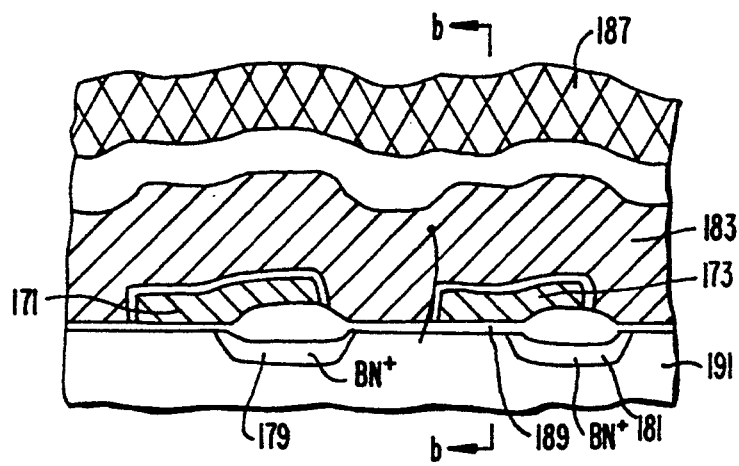
FIG. 27 is a cross-sectional view of the embodiment of FIG. 25, taken at section a—a thereof.

A fifth embodiment is illustrated with respect to FIGS. 25-27. Four cells of a much larger memory cell array are shown in plan view in FIG. 25, including floating gates 171, 173, 175 and 177. Elongated source and drain diffusions 179 and 181 are oriented with their lengths extending in one direction, while control gates 183 and 185 extend along the thick oxide channels through a large number of memory cells in each channel. The lengths of the control gates 183 and 185 are oriented substantially orthogonally with the orientation of the lengths of the source and drain diffusions 179 and 181. In this embodiment, an erase gate is provided as a uniform layer 187.

The fifth embodiment of FIGS. 25-27 has many detailed structural features in common with the prior embodiments, and is of a type of cell illustrated in the conceptual drawings of FIGS. 2 and 3. A gate oxide layer 189 provided on a surface of the semiconductor substrate 191 has the floating gates and control gates formed thereover in a split-channel configuration. A main distinction between this embodiment and the second embodiment of FIGS. 17 and 18 is that the control gates 183 and 185 are formed entirely within the floating gate and have an isolation oxide layer, such as layers 193 and 195, on top thereof. The erase gate 187 can now be a continuous, two-dimensional layer, for convenience, and coupled with both top edges of each floating gate through erase dielectric layers, such as layers 197 and 199. The embodiment of FIGS. 25-27 has an advantage of a very narrow cell width since the floating gates are formed totally within the trenches etched into the thick oxide layer. Nothing extends outside of that trench that effectively expands its size.

Alternate Trench Forming Process

In each of the embodiments described above, trenches in the thick oxide layer are initially formed with vertical sidewalls by an anisotropic etch process. (See, for example, FIGS. 10B and 19B) A significant advantage of this structure is that it minimizes the width of the memory cells, and thus maximizes their density in one direction across an integrated circuit chip. With some configurations and processes, however, there are advantages to reduce the slope of the trench sidewalls by widening the top portion of the trenches, although this does result in a larger cell and a somewhat lower packing density.

Figure 28A:
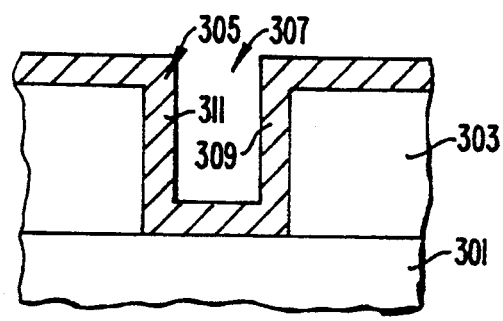
FIG. 28A demonstrates a characteristic of the process described in embodiments illustrated in prior Figures.

The sectional view of FIG. 28A illustrates a potential limitation of the anisotropic trench forming technique described above. When a polysilicon layer 305 is deposited on a trenched thick oxide layer 303 on a semiconductor substrate 301, polysilicon material portions 309 and 311 along the vertical sides of an oxide trench 307 are very thick vertically, as shown. When a layer of polysilicon material is separated into individual floating gate strips by an anisotropic etch process, the amount of etching required to remove the sidewall buildups 309 and 311 causes the oxide, substrate and other layers immediately beneath the vertically thinner portions of the polysilicon to be etched after those portions of the polysilicon have been removed. Of course, the etchant used is one that removes polysilicon at a rate many times that of the material underlying the polysilicon but even this can result in too much underlying material being removed in some situations. An example is where the underlying layer includes a thin gate oxide whose resulting thickness needs to be carefully controlled and where a great deal of etching of it is undesirable.

Figure 28B:
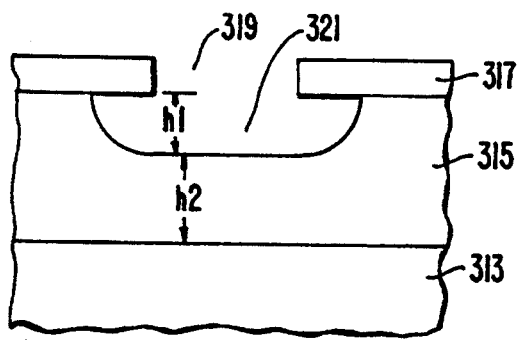
FIGS. 28B, 28C, 28D and 28E show sequential steps of a modification to the process described in embodiments illustrated in prior Figures.

Accordingly, where necessary, the walls of the trenches can be made to partially slope away from the trench, in a top portion, in order to reduce the vertical extent of the polysilicon that is subsequently deposited along the sidewalls. Referring to FIG. 28B, a substrate 313 has a thick oxide layer 315 deposited on it. A photoresist layer 317 is exposed to a pattern of the trenches to be formed in the oxide layer 315 and processed to provide openings such as an opening 319. A first step in forming the trenches is an isotropic etching step, one approach being a conventional wet etch. The etch operation is allowed to continue until oxide is removed under the opening 319 to a depth h1, oxide thus also being removed from beneath the photoresist mask 317 adjacent the opening 319.

Figure 28C:
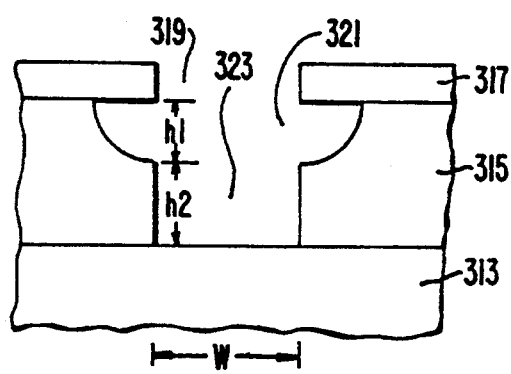

The trench is completed by a subsequent anisotropic etching step, as illustrated in FIG. 28C, where a bottom portion 323 is formed to have vertical sidewalls and a depth h2. The width W of the bottom portion of the trench is substantially that of the width of the mask opening 319. The relative depths h1 and h2 are chosen to accommodate the various dimensions of the devices and specific process parameters utilized to make them. The smaller h1 is made to be, the narrower are the devices for a given minimum trench bottom width W. Therefore, h1 is made to be no larger than necessary to allow complete removal of the subsequently formed polysilicon layer without any undesired side effects caused by the etching step. Generally, for application of this technique in modifying the embodiments described above, the isotropic etch depth h1 is chosen to be from one-third to one-half the total depth h1+h2 of the trench.

Figure 28D:
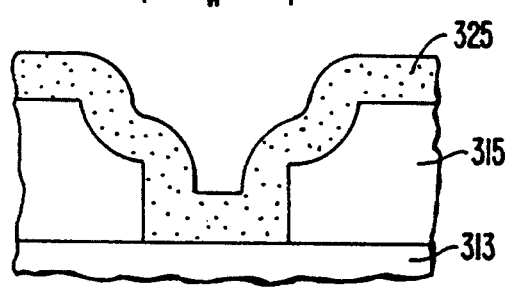
Figure 28E:
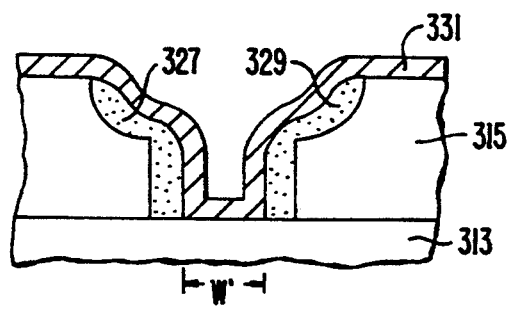

The next steps, illustrated in FIG. 28D, include removal of the photoresist mask layer 317 and deposition overall of an oxide layer 325. After an anisotropic etch of the oxide layer 325, trench sidewall spacers 327 and 329 remain. Formation of the spacers 327 and 329 controls the resulting trench bottom width W'. A layer 331 of polysilicon is then deposited over the structure. The reduced vertical extent of the polysilicon along the trench sidewalls, compared to that of FIG. 28A, is apparent. Removal of portions of the polysilicon layer 331 spanning the trench is then made easier.

Erase Gate and Tunneling Oxide Formation

No details have yet been given with respect to the erase dielectric layers positioned between the floating gates and the erase gates in the embodiments described. Referring first to the first embodiment of FIGS. 6-15, electrons are transmitted between the erase and floating gates by tunnelling through dielectric layers 85 and 87. The mechanism of electrons tunneling from the floating gates to the erase gate through the erase dielectric has been extensively studied, and is referred to as "Fowler-Nordheim tunneling". Asperities formed in the surface of the conductive polysilicon on the side of the dielectric that is the source of the electrons are believed to help locally concentrate and increase the fields in order to promote such electron tunneling.

However, in the second, third and fourth embodiments described above, where the erase gates are formed from the first polysilicon layer to be deposited, electrons must now travel to the first polysilicon layer. For example, with reference to FIG. 17, erasure of the floating gate 127 requires electrons to travel through the erase dielectric 151 to the erase gate 147 that has been formed from the first deposited polysilicon layer. As can be seen, asperities cannot be included on the floating gates since the second polysilicon layer from which they are formed is deposited on top of the erase dielectric 151. Asperities can be generated on the surface of the erase gate, since it was formed first, but this has a detrimental effect to tunneling of electrons toward it. Indeed, the usual asperity-enhanced tunneling mechanism cannot be utilized in the case where the erase gates are formed before the floating gates.

One way to provide the necessary tunneling in this circumstance is to make the tunnel oxide layer between the erase and floating gates sufficiently thin, no greater than about 200 Angstroms and preferably around 100 Angstroms or less in thickness. However, oxide layers this thin are difficult to make reliably.

In order to provide the necessary electron tunneling without having to make the oxide layer so thin, according to another aspect of the present invention, the dopant required to make the first polysilicon layer conductive is preferably included in the material initially deposited, termed "in situ" doped polysilicon. This is in contrast to the more usual technique of first depositing undoped polysilicon, which is effectively non-electrically conductive, and then doping the layers by ion implantation or a subsequent separate furnace doping operation. A virgin oxide layer is then grown on the polysilicon layer as the tunnel erase dielectric. That is, the oxide is grown on a surface that has not previously had an oxide layer grown on it. Currently, a "sacrificial" oxide layer is grown on, and then stripped away from, the first polysilicon layer which normally forms the floating gate, in order to create asperities in the polysilicon surface before growing the erase oxide. But this step is purposely avoided with the first polysilicon layer in the second, third and fourth embodiments, since that layer forms the erase gate and asperities on it are undesirable in order to achieve the reverse tunneling. It will be noted, however, with reference to the embodiment of FIG. 17, for example, that some oxide is necessarily grown on the surface of the first polysilicon layer (145, 147, 149 of FIGS. 19A and 19B) in the course of depositing the thick oxide layer (141 of FIGS. 19A and 19B) on it, but the critical erase oxide layers (151 and 153 of FIG. 20B) are formed on fresh polysilicon edges resulting from portions of this layer being etched away.

The in situ doped first polysilicon layer is formed by deposition on a semiconductor wafer held within a range of about 620 to 670 degrees Celsius in a gaseous atmosphere of silane and an n-type dopant such as phosphine. A temperature of about 640 degrees Celsius is preferred. The doping concentration is chosen to result in a sheet resistivity within about 100 to 1000 ohms per square. The thickness of the layer is chosen to be generally within a range of from 1000 to 3000 Angstroms. This process allows rather precise control of the polysilicon layer thickness, resulting in being able to define the etched edge area that interfaces with the subsequently formed floating gate and thus control the coupling between the erase and floating gates.

The erase oxide layers (151 and 153 of FIG. 20B, for example) are grown to a thickness of from about 200 to 500 Angstroms on the etched edges of the first polysilicon layer by a conventional process. For example, a dry oxygen process may be employed at a temperature within a range of from about 900 to 1050 degrees Celsius. Alternatively, a wet oxygen process at a lower temperature may be used.

After the erase oxide layers are grown, the techniques used for the rest of the process are more conventional. The second polysilicon layer from which the floating gates are formed (see the strips 155 and 156 of FIGS. 21A and 21B, for example) may be deposited as undoped and then subsequently doped by either an ion implantation or a furnace diffusion process. If an in situ process of the type discussed above for the first polysilicon layer is used in the deposition of the second polysilicon layer, it must be done at a lower temperature, such as in a range of about 560 to 580 degrees Celsius with about 570 degrees being preferred. The higher temperature process described above is to be avoided since it may undesirably result in electron tunneling through an oxide layer 157 (FIGS. 21A and 21B) between the resulting floating gates (formed from strips 155 and 156) and control gates 159 formed from a third polysilicon layer. The high temperature in situ process is limited in its applicability to situations where reverse electron tunneling is desired.

The resulting devices of the second, third and fourth embodiments are characterized by a higher conductance from the second formed polysilicon layer (from which the floating gates are formed) to the first formed polysilicon layer (from which the erase gates are formed) than exists in the opposite direction. It is the higher conduction from the first to the second polysilicon layers that is more normal, as utilized in the first embodiment described herein. In addition to providing this efficient reverse tunneling, a memory cell so constructed has an increased life in terms of being able to handle more programming/erase cycles than other structures. This is believed to be due to less electron trapping in the erase dielectric layer so formed.

Two Erase Gate Operation

It will be noted from the foregoing description that each floating gate of the first, second, third and fourth embodiments (See the cross-sectional views of FIGS. 7, 17, 22, and 24, respectively) is coupled to two erase gates, one on each side. Referring to FIG. 7, for example, a cross-sectional view of the finished cell of the first embodiment, an erase gate is positioned between each adjacent pair of trenches. It may be adequate for some devices to eliminate every other erase gate, leaving each floating gate coupled with one erase gate. This is possible with the embodiment shown in FIG. 7 since the polysilicon layer from which the erase gates are formed is deposited, in a third polysilicon layer, after the floating and control gates are formed. It is straight forward to remove the third polysilicon layer in a manner that leaves only every other one of the erase gates shown in FIG. 7.

By coupling the floating gate to only one erase gate, the parasitic capacitive coupling between the floating and erase gates is significantly reduced (essentially cut in half) when compared to the case where both erase gates are used. As a result, the efficiency of erasing that results from this reduced parasitic coupling is increased.

Alternately, if the floating gate of each cell is coupled to erase gates on its opposite sides, operational advantages may be had by holding one of them at ground or a negative potential while the cell is being erased, the other being driven to a positive erase voltage ($V_e$). Referring to the example illustration of FIG. 29, alternate erase gates (such as conductive strips 145 and 149) are connected to ground potential while the remaining erase gates (including conductive strip 147) are connected through a switch 213 to an erase voltage supply 211 when an erase operation is being performed. This has a significant advantage in reducing the amount of parasitic voltage that is coupled to the floating gate by the a given erase voltage $V_e$ supply and still perform an adequate erase. Even a small parasitic voltage reduction significantly increases the number of write/erase cycles that the array cells can achieve for a fixed $V_e$. Further, the grounding of every other erase gate strip allows an array to be easily separated into adjacent sectors of several columns or rows of memory cells that can be flash erased independently of each other, without having to build the array with a physical break between sectors. The erase voltage $V_e$ is then applied independently to the ungrounded alternate erase gates of each sector.

Figure 29:
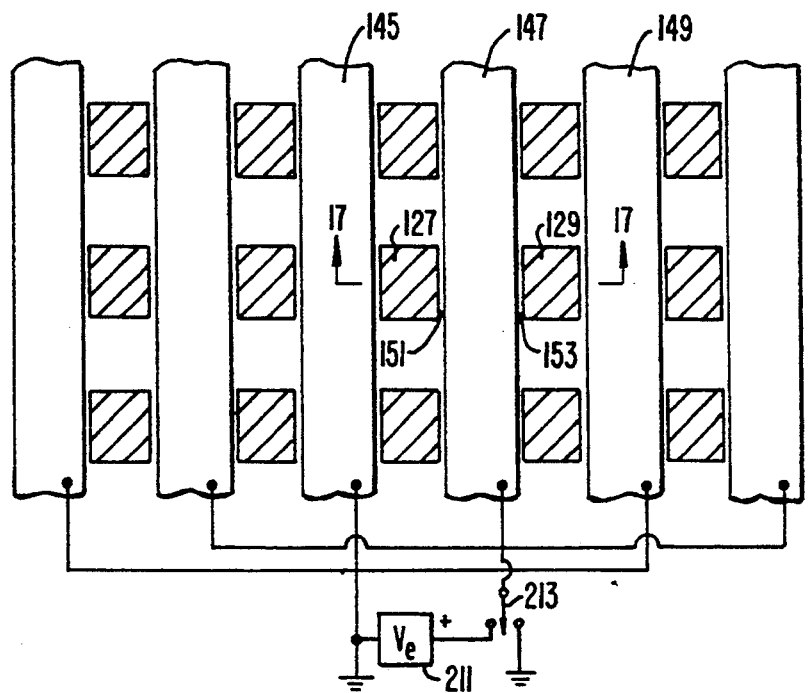
FIG. 29 is a sectional plan view showing principal elements of the embodiment of FIGS. 16–18, looking downward, taken across section 29—29 of FIG. 17.
Figure 30:
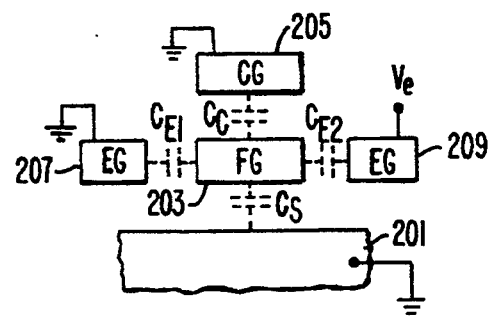
FIG. 30 schematically illustrates the capacitive coupling of a floating gate of the embodiment of FIGS. 16–18 with other elements of that structure.

Referring to the schematic illustration of FIG. 30, the coupling between and voltages applied to the various gates of a memory cell of FIG. 29 during erase are shown. A floating gate 203 is coupled to a substrate 201 by a capacitance $C_s$, to a control gate by a capacitance $C_c$, to a first erase gate 207 by a capacitance $C_{E1}$, and to a second erase gate 209 by a capacitance $C_{E2}$.

Although the various aspects of the present invention have been described with respect to certain specific illustrative embodiments thereof, it will be understood that the invention is entitled to protection within the full scope of the appended claims.

It is claimed:

1. A method of forming an electrically programmable memory device on a semiconductor substrate, comprising the steps of:

forming source and drain regions within the substrate at one surface thereof, depositing a layer of isolation dielectric to a thickness on said substrate surface, said substrate surface being characterized by being substantially planar at least between the source and drain regions, removing portions of the isolation dielectric layer to form a trench that exposes the substantially planar substrate surface along a length thereof between said source and drain regions, said trench having a cross-sectional shape in a direction orthogonal to the substrate surface with a depth equal to said dielectric layer thickness and at least a segment of the depth adjacent the substrate surface being rectangularly shaped with a width between sidewalls thereof that is equal to or less than two times said isolation dielectric layer thickness, said removing step being accomplished without removing any substantial amount of the substrate within the trench, forming a gate dielectric layer on the exposed substrate surface within said trench, forming an electrically conductive floating gate over said gate dielectric and within said trench, forming a control gate dielectric layer over said floating gate, and forming an electrically conductive control gate over said floating gate, whereby said floating and control gates are capacitively coupled between opposing surface areas thereof which are separated by said control gate dielectric layer.

2. The method according to claim 1 which additionally comprises the step, after forming the trench but before growing the gate dielectric layer, of forming dielectric spacers along the trench sidewalls to alter its cross-sectional shape to have opposing side surfaces separated by less than the trench width at a location adjacent the substrate surface but gradually increasing as a function of distance away from said substrate surface to a width that is equal to or less than the original trench width.

3. The method according to claim 2 wherein the step of forming the spacers causes the separation between the side surfaces at the substrate surface to be approximately one-half the width of the trench before forming the side surfaces.

4. The method according to claim 2 wherein the step of forming the floating gate includes limiting the length of said floating gate to less than the trench length between the source and drain regions and further wherein the step of forming the control gate also includes forming said control gate over the gate dielectric layer along said portion of the trench, whereby a split channel memory device results.

5. The method according to claim 1 wherein the step of forming the dielectric layer on the substrate surface includes causing said thickness to be greater than 0.2 microns.

6. The method according to claim 1 wherein the steps of forming the floating gate, forming a dielectric layer thereover, and then forming the control gate are cooperatively accomplished in a manner that at least thirty-five percent of the capacitively coupled opposing surface areas are formed with surfaces oriented within the trench to be substantially orthogonal to the substrate surface.

7. The method according to claim 1 wherein the step of forming the floating gate includes doing so in a manner that a slot exists in the floating gate along the length of the trench, and further wherein the step of forming the control gate includes doing so within said floating gate slot.

8. The method according to claim 1 wherein the step of forming the floating gate includes doing so in a manner that the trench is substantially filled therewith for a finite distance that leaves end walls of the floating gate that are oriented substantially orthogonally to the substrate surface, and further wherein the step of forming the control gate includes doing so along said orthogonal end floating gate surfaces.

9. The method according to claim 1 which additionally comprises the steps, after the step of forming the control gate, of forming an erase gate dielectric on a portion of the floating gate adjacent an opening of the trench removed from the substrate, and thereafter forming an electrically conductive erase gate over the erase dielectric.

10. The method according to claim 1 which additionally comprises the steps, after the step of forming the source and drain regions but before the step of forming the isolation dielectric layer, of forming a gate dielectric layer on said substrate surface and then forming an electrically conductive erase gate thereover, wherein the subsequent step of removing some of the dielectric layer to form a trench includes forming said trench adjacent said erase gate in a manner that a sidewall of the erase gate is exposed through a sidewall of the trench, and which additionally comprises the step of forming an erase dielectric layer on the exposed portion of the erase gate sidewall before the step of forming the floating gate.

11. The method according to claim 10 wherein the step of forming the erase gate includes the step of depositing in-situ doped polysilicon, and wherein the step of forming an erase dielectric includes growing only one oxide layer on said erase gate sidewall.

12. The method according to claim 1 wherein the step of removing portions of the isolation dielectric to form the trench includes a single anisotropic etching step.

13. The method according to claim 1 wherein the step of removing portions of the isolation dielectric to form the trench includes the steps of removing an initial portion of the isolation dielectric by an isotropic etch through a mask opening and thereafter removing a remaining portion of the isolation dielectric layer by an anisotropic etch through said mask opening.

14. The method according to claim 13 wherein the isotropic etch step includes the step of removing one-half or less of the thickness of the isolation dielectric layer, whereby said at least a segment of the depth adjacent the substrate surface is equal to or greater than one-half the thickness of said isolation dielectric layer.

15. A method of forming a two dimensional array of electrically programmable memory devices on a semiconductor substrate, comprising the steps of:

forming in one substantially planar surface of the substrate a plurality of elongated parallel source and drain regions with their lengths extending in one direction across the substrate and spaced apart in a second direction across said substrate, said first and second directions being substantially perpendicular to each other, depositing a substantially uniform thickness layer of isolation dielectric directly on said semiconductor substrate, forming in said isolation dielectric layer a plurality of elongated parallel trenches extending through said layer to said substantially planar substrate surface in a manner that they have a substantially rectangular cross-sectional shape in at least a segment adjacent the substrate surface that is a portion of their depth and with a width in said segment that is equal to or less than two times their depth, said trenches having their lengths extending in said second direction and being spaced apart in said first direction, growing a gate dielectric on the substrate surface within said trenches, depositing a first electrically conductive layer over said isolation dielectric and within the trenches in a manner that grooves are left along the length of the trenches, removing portions of said first electrically conductive layer to leave a plurality of floating gates spaced along the length of the trenches, said floating gates extending at least part of the distance between adjacent source and drain diffusion regions, the floating gates of one trench being separated from those of other trenches, forming a layer of control gate oxide on said floating gates, depositing a second electrically conductive layer over the structure in a manner to substantially fill the floating gate grooves and trenches, removing portions of said second electrically conductive layer to leave a plurality of elongated parallel control gates extending along the trenches.

16. A method of forming a two dimensional array of electrically programmable memory devices on a semiconductor substrate, comprising the steps of:

forming in one substantially planar surface of the substrate a plurality of elongated parallel source and drain regions with their lengths extending in one direction across the substrate and spaced apart in a second direction across said substrate, said first and second directions being substantially perpendicular to each other, depositing a predetermined substantially uniform thickness layer of isolation dielectric in a manner that it is carried by the substrate, forming in said isolation dielectric layer a plurality of elongated parallel trenches extending through said layer to said substantially planar substrate surface in a manner that they have a substantially rectangular cross-sectional shape in at least a segment adjacent the substrate surface that is a significant portion of their depth and with a width in said segment that is equal to or less than two times their depth, said trenches having their lengths extending in said second direction and being spaced apart in said first direction, growing a gate dielectric on the substrate surface within said trenches, depositing a first electrically conductive layer over said isolation dielectric and within the trenches in a manner to fill said trenches, removing portions of said first electrically conductive layer to leave a plurality of floating gates spaced along the length of the trenches and having ends within the trench that are oriented substantially orthogonal to said substrate surface, said floating gates extending at least part of the distance between adjacent source and drain diffusion regions, the floating gates of one trench being separated from those of other trenches, forming a layer of control gate oxide over said floating gates, depositing a second electrically conductive layer over the structure in a manner to cover the floating gates and substantially fill the trenches, removing portions of said second electrically conductive layer to leave a plurality of elongated parallel control gates extending along the trenches.

17. The method according to either of claims 15 or 16 wherein the step of forming the trenches includes the step of forming spacers along the trench sidewalls to alter their cross-sectional shape to narrow a distance between opposing trench sidewalls adjacent the substrate surface.

18. The method according to either of claims 15 or 16 wherein the step of forming the trenches includes the step of forming such trenches with a width adjacent the substrate surface that is equal to or less than their depth.

19. The method according to either of claims 15 or 16 which additionally comprises the step, prior to the step of depositing the isolation dielectric layer, of forming a third electrically conductive layer insulated from the substrate, and wherein the step of forming the isolation dielectric layer includes depositing said isolation dielectric layer on said third conductive layer and the step of forming the trenches includes removal of the third conductive layer from regions of the trenches, thereby to leave a plurality of elongated erase gates with their lengths extending in said second direction and positioned between the trenches with opposite side surfaces abutting walls of adjacent trenches.

20. The method according to either of claims 15 or 16 which additionally comprises the step, prior to the step of forming trenches in the isolation dielectric layer, of forming a third electrically conductive layer over the isolation dielectric, and wherein the step of forming the trenches includes removal of the third conductive layer from regions of the trenches, thereby to leave a plurality of elongated erase gates with their lengths extending in said second direction and positioned between the trenches with opposite side surfaces abutting walls of adjacent trenches.

21. The method according to either of claims 15 or 16 which additionally comprises the step, prior to the step of forming trenches in the isolation dielectric layer, of forming a third electrically conductive layer insulated from the substrate, and wherein the step of forming the trenches includes removal of the third conductive layer from regions of the trenches, thereby to leave a plurality of elongated erase gates with their lengths extending in said second direction and positioned between the trenches with opposite side surfaces abutting walls of adjacent trenches, said method additionally including the steps, prior to the step of depositing the first conductive layer, of exposing the erase gate sidewalls into their abutting trenches and growing only one oxide layer thereon, thereby forming an erase gate dielectric.

22. The method according to either of claims 15 or 16 which additionally comprises the step, prior to the step of forming trenches in the isolation dielectric layer, of forming a third electrically conductive layer insulated from the substrate, and wherein the step of forming the trenches includes removal of the third conductive layer from regions of the trenches, thereby to leave a plurality of elongated erase gates with their lengths extending in said second direction and positioned between the trenches with opposite side surfaces abutting walls of adjacent trenches, said method additionally including the steps, prior to the step of depositing the first conductive layer, of exposing the erase gate sidewalls into their abutting trenches and growing only one oxide layer, thereby forming an erase gate dielectric, and further wherein the step of depositing the first conductive layer includes the step of depositing in-situ doped polysilicon.

23. The method according to either of claims 15 or 16 wherein the step of forming the trenches includes a single anisotropic etching step.

24. The method according to either of claims 15 or 16 wherein the step of forming the trenches includes the steps of removing an initial portion of the isolation dielectric by an isotropic etch through a mask opening until a portion of the isolation dielectric layer is removed, and thereafter removing a remaining portion of the isolation dielectric layer by an anisotropic etch through said mask opening.

* * * * *